US006879476B2

(12) United States Patent
Khazhinsky et al.

(10) Patent No.: US 6,879,476 B2
(45) Date of Patent: Apr. 12, 2005

(54) ELECTROSTATIC DISCHARGE CIRCUIT AND METHOD THEREFOR

(75) Inventors: Michael G. Khazhinsky, Austin, TX (US); James W. Miller, Austin, TX (US); Michael Stockinger, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 142 days.

(21) Appl. No.: 10/348,814

(22) Filed: Jan. 22, 2003

(65) Prior Publication Data

US 2004/0141267 A1 Jul. 22, 2004

(51) Int. Cl.[7] ............................................... H02H 9/00
(52) U.S. Cl. ........................................................ 361/56
(58) Field of Search ......................... 361/56, 93.1, 93.2, 361/93.3, 91.5, 111

(56) References Cited

U.S. PATENT DOCUMENTS

| 4,734,752 A | 3/1988 | Liu |
| 4,870,530 A | 9/1989 | Hurst |
| 4,930,037 A | 5/1990 | Woo |
| 4,987,465 A | 1/1991 | Longcor |
| 5,208,719 A | 5/1993 | Wei |
| 5,345,357 A | 9/1994 | Pianka |
| 5,361,185 A | 11/1994 | Yu |
| 5,946,177 A * | 8/1999 | Miller et al. .................. 361/56 |
| 6,075,271 A | 6/2000 | Smith |
| 6,091,594 A * | 7/2000 | Williamson et al. ........ 361/111 |
| 6,284,616 B1 | 9/2001 | Smith |
| 6,327,126 B1 | 12/2001 | Miller |
| 6,329,692 B1 | 12/2001 | Smith |
| 6,373,104 B1 | 4/2002 | Smith |
| 6,426,665 B1 * | 7/2002 | Morishita .................... 327/310 |

FOREIGN PATENT DOCUMENTS

| EP | 0385581 B1 | 9/1990 | ......... H03K/19/003 |
| WO | WO/01/47018 A1 | 6/2001 | ........... H01L/27/02 |

OTHER PUBLICATIONS

Duvvury et al., "Dynamic Gate Coupling of NMOS for Efficient Output ESD Protection," IEEE, 1992 International Reliability Physics Symposium (IRPS), pp. 141–150, no month.

Nikolaidis et al, "Impact of I/O Buffer Configuration on the ESD Performance of a 0.5um CMOS Process," 1995 EOS/ESD Symposium 95–34, pp. 1.5.1–1.5.9, no month.

Krakauer et al, "ESD Protection in a 3.3V Sub–Micron Silicided CMOS Technology," EOS/ESD 1992 Symposium 92–250, pp. 5B.4.1–5B.4.8, no month.

Guggenmos et al., "A New ESD Protection Concept for VLSI CMOS Circuits Avoiding Circuit Stress," EOS/ESD Symposium Proceedings 1991, pp. 74–76, no month.

Smith, "An Anti–Snapback Circuit Technique for Inhibiting Parasitic Bipolar Conduction During EOS/ESD Events," EOS/ESD Symposium 99–62, pp. 2A.1.1–2A.1.8, no month 1999.

(Continued)

*Primary Examiner*—Ronald Leja
(74) *Attorney, Agent, or Firm*—Susan Hill

(57) ABSTRACT

An ESD protection circuit (81) and a method for providing ESD protection is provided. In some embodiments, an N-channel transistor (24), which can be ESD damaged, is selectively turned on and made conducting. The purpose of turning on the N-channel transistor (24) is to maximize the Vt1 of the N-channel transistor (24). Vt1 is the drain-to-source voltage point at which the parasitic bipolar action of the N-channel transistor (24) first occurs. In some embodiments, the ESD protection circuit (81) includes a diode (64) which provides an additional current path from the I/O pad 31 to a first power supply node (76).

24 Claims, 4 Drawing Sheets

OTHER PUBLICATIONS

Chen, "The Effects of Interconnect Process and Snapback Voltage on the ESD Failure Threshold of NMOS Transistors," IEEE Transactions on Electron Devices, vol. 35, No. 12, Dec., 1988, pp. 2140–2150.

Chen, "Effects of Interconnect Process and Snapback Voltage on the ESD Failure Threshold of NMOS Transistors," 1988 EOS/ESD Symposium Proceedings, pp. 212–219, no month.

Polgreen et al., "Improving the ESD Failure Threshold of Silicided nMOS Output Transistors by Ensuring Uniform Current Flow," 1989 EOS/ESD Symposium Proceedings, pp. 167–174, no month.

Dabral et al, Core Clamps for Low Voltage Technologies, INTEL Corporation, Santa Clara, CA, pp. 3.6.1–3.6.9, no date.

* cited by examiner

|  | CASE 1 (PATH 1) | CASE 2 (PATH 1 AND PATH 2) | CASE 3 (PATH 1 AND PATH 3) | CASE 4 (PATH 1 AND PATH 2 AND PATH 3) |
|---|---|---|---|---|
| V, I/O PAD 31 (V) | 8 | 7.6 | 7.87 | 7.56 |
| V, NODE 80 (V) | 8 | 6.56 | 7.03 | 6.2 |
| V, NODE 74 (V) | 4.76 | 4.48 | 4.73 | 4.48 |

FIG. 7

ELECTROSTATIC DISCHARGE CIRCUIT AND METHOD THEREFOR

REFERENCE TO RELATED APPLICATION

The present application is related to "ELECTROSTATIC DISCHARGE CIRCUIT AND METHOD THEREFOR", invented by James W. Miller et al., Ser. No. 10/348,939, filed concurrently herewith, and assigned to the assignee hereof.

FIELD OF THE INVENTION

The present invention generally relates to circuits, and more particularly, to a circuit and method for reducing potential damage to an integrated circuit during an electrostatic discharge.

RELATED ART

An integrated circuit can be damaged when subjected to a voltage that is higher than the design voltage of the integrated circuit. Electrostatic discharge ("ESD"), originating from such sources as a mechanical chip carrier, a plastic chip storage device, or even a human being can generate a voltage that is many times greater than the design voltage of the integrated circuit. For example, the typical human body can supply an electrostatic discharge of up to 4 kilovolts. For integrated circuits that operate at voltages of less than, for example, 5V (volts), an electrostatic discharge of such proportions can be devastating.

In order to protect the internal circuitry from high voltage, or ESD, events, protection circuits are utilized, generally between the internal circuitry and the input/output ("I/O") pins of the integrated circuit. One mechanism that can cause circuit failures during ESD events is a phenomenon known as "bipolar snapback".

FIG. 1 illustrates, in partial schematic diagram form and partial cross-sectional view, an N-channel metal-oxide semiconductor (MOS) transistor and an inherent parasitic bipolar transistor in accordance with the prior art. As FIG. 1 illustrates, an NPN bipolar device is formed in the p substrate having an emitter coupled to the source, a collector coupled to the drain, and a base coupled to the substrate of an N-channel MOS (NMOS) transistor. In FIG. 1, the substrate tie and the source are illustrated coupled to ground with the drain coupled to an I/O pad. The I/O pad is shown receiving a positive ESD event.

During bipolar snapback, the parasitic bipolar device formed by an n+ diffusion coupled to the I/O pad (collector) and an n+ diffusion coupled to ground (emitter), can conduct large amounts of ESD discharge current by means of a self-biased mechanism through the inherent substrate resistance labeled "Rsub". The self-biasing results from avalanche-breakdown at the collector-base (i.e. n+ drain to p-substrate) junction where avalanche-generated electron-hole pairs are created. The avalanche-generation source is shown schematically as current source Igen in FIG. 1, which represents substrate (hole) current. The holes generated from this effect migrate towards the substrate tie through the inherent substrate resistance, thereby producing a local elevation in the substrate potential near the transistor. Once this potential exceeds roughly 0.7V, it is sufficient to forward bias the base-emitter junction (i.e. n+ to p-substrate) of the parasitic device, thereby turning the device on. The drain-to-source voltage and drain current point at which parasitic bipolar action first occurs is called (Vt1, It1). Usually, the bipolar device inherently contained in the N-channel MOS device of, for example, an output buffer is the most susceptible to snapback. This parasitic device is frequently the point of failure in a circuit subjected to an ESD event.

One well-known solution to alleviate this parasitic bipolar problem is to add a ballast resistor connected between the drain of the N-channel MOS transistor and an output pin. This technique helps ensure some added measure of ESD protection in the event of bipolar conduction in the circuit by equally distributing any discharge current through the NMOS transistor (or several fingers forming a single NMOS transistor). The ballast resistor is added to ensure that the failure point at another collector-to-emitter voltage Vt2, is greater than the collector-to-emitter voltage, Vt, where the current begins to flow in the parasitic bipolar transistor. The relationship between Vt1 and Vt2 is illustrated in FIG. 2.

FIG. 2 illustrates a diagram of drain current versus drain voltage of the N-channel transistor of FIG. 1. FIG. 2 shows two curves. One curve illustrates drain current versus drain-to-source voltage for a typical non-salicided technology and the other curve illustrates drain current versus drain-to-source voltage for a typical salicided technology. When several NMOS transistors (or several fingers forming a single NMOS transistor) act as a parasitic bipolar device, such a device relies upon the "snapback" current-voltage characteristics of the inherent parasitic bipolar transistor. As stated above, a current begins to flow through the bipolar transistor at a certain collector-to-emitter voltage, Vt1. Thereafter the collector-to-emitter voltage decreases as the current increases, "snapping back" from Vt1. As drain voltage increases, the trend reverses, causing the collector-to-emitter voltage to rise as the current also rises. Eventually, the bipolar transistor fails at another particular collector-to-emitter voltage Vt2. In a typical non-salicided technology, Vt2 is usually greater than Vt1 since the on-resistance exhibited by the transistor is quite high (i.e. the slope of the line in FIG. 2 is less steep). In a typical salicided technology, Vt2 is usually less than Vt1, since the salicided source/drain diffusions act to lower the effective series resistance of the device (i.e. the slope of the line in FIG. 2 is more steep). In either technology, Vt2 can be controlled to be greater than Vt1 by adding series resistance in the form of a ballast resistor. This guarantees that the first NMOS transistor (or finger of the NMOS transistor) does not break down at a voltage less than the voltage at which the second NMOS transistor turns on. This in turn guarantees that the failure current of the complete device is the sum total of its individual components rather than that of the first segment which snaps-back. The failure current is the second breakdown current, It2, shown in FIG. 2. The value of It2 must not be exceeded during an ESD event or else permanent damage will result in the device. Thus, the motivation for adding ballast resistance is to maximize the total amount of It2 available from a given transistor. In general, It2 depends on specific fabrication parameters of a particular technology, and varies from technology to technology.

The general trend with semiconductor technology scaling has been a reduction in It2 for each new generation of technology. This is due to several factors such as the use of shallow, salicided source/drain junctions and the use of epitaxial layer on heavily doped p+ substrates. In addition to promoting poor width-scaling in multi-finger devices, the salicide layer also consumes a significant portion of the junction depth which is also known to reduce second breakdown failure current thresholds (It2). Epi-substrates exhibit a very low substrate resistance, which allows the substrate potential to be closely coupled to ground all over the chip. While this is desirable for avoiding latch-up, it severely impedes parasitic bipolar action since it becomes difficult to uniformly initiate and sustain bipolar action.

BRIEF DESCRIPTION OF THE DRAWINGS

The present invention is illustrated by way of example and not limited by the accompanying figures, in which like references indicate similar elements, and in which:

FIG. 7 illustrates, in tabular form, relationships between voltages at I/O pad 31, node 80, and node 74 for a plurality of ESD current paths.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

While several embodiments of the present invention will be described in detail below, the present invention common to all embodiments lies in an ESD protection circuit and method for maximizing the effective Vt1 of the N-channel transistor to be protected. The present invention inhibits bipolar snapback in advanced semiconductor technologies where an almost instantaneous destruction of the device occurs once Vt1 has been exceeded (i.e., Vt2=Vt1). For these devices, it is not sufficient to ameliorate the effects of bipolar snapback once it has occurred, since a very low value of failure current, It2, is exhibited. Rather, for these technologies, it is desirable to avoid snapback altogether and care must be taken to increase the effective value of Vt1 so that the output buffer NMOS device does not snapback during an ESD discharge. This significantly differs from the conventional wisdom of trying to control parasitic bipolar action after snapback with well-known techniques such as ballasting.

Figure 1:
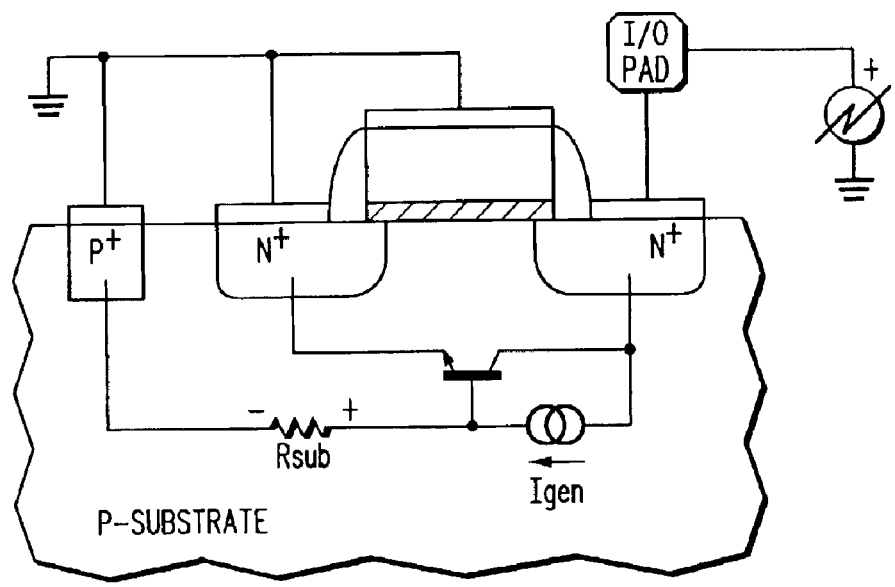
FIG. 1 illustrates, in partial schematic diagram form and partial cross-sectional view, an N-channel MOS transistor and an inherent parasitic bipolar transistor in accordance with the prior art.
Figure 2:
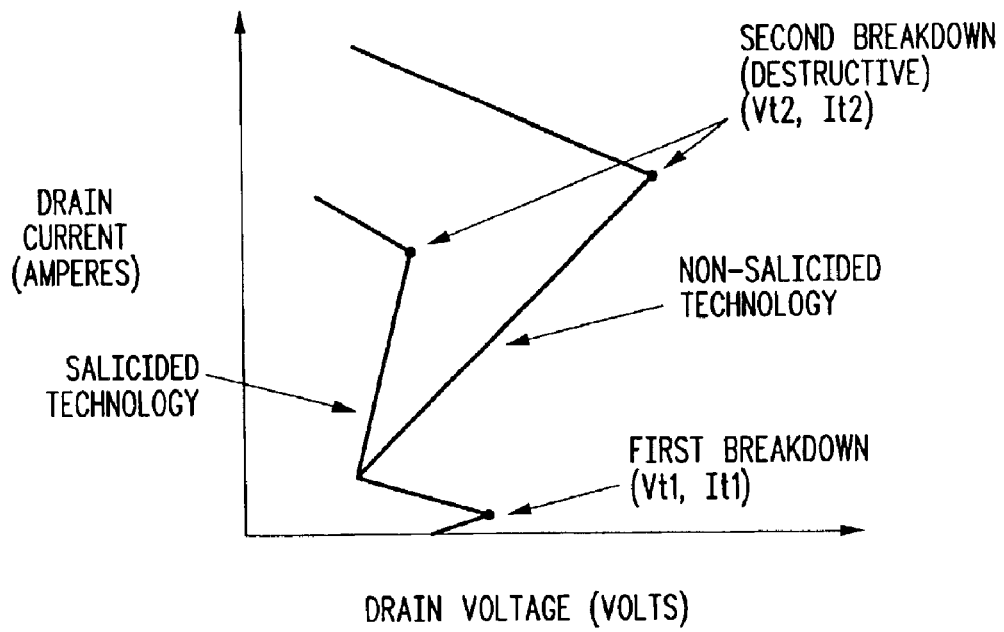
FIG. 2 illustrates a diagram of drain current versus drain voltage of the N-channel MOS transistor of FIG. 1.
Figure 3:
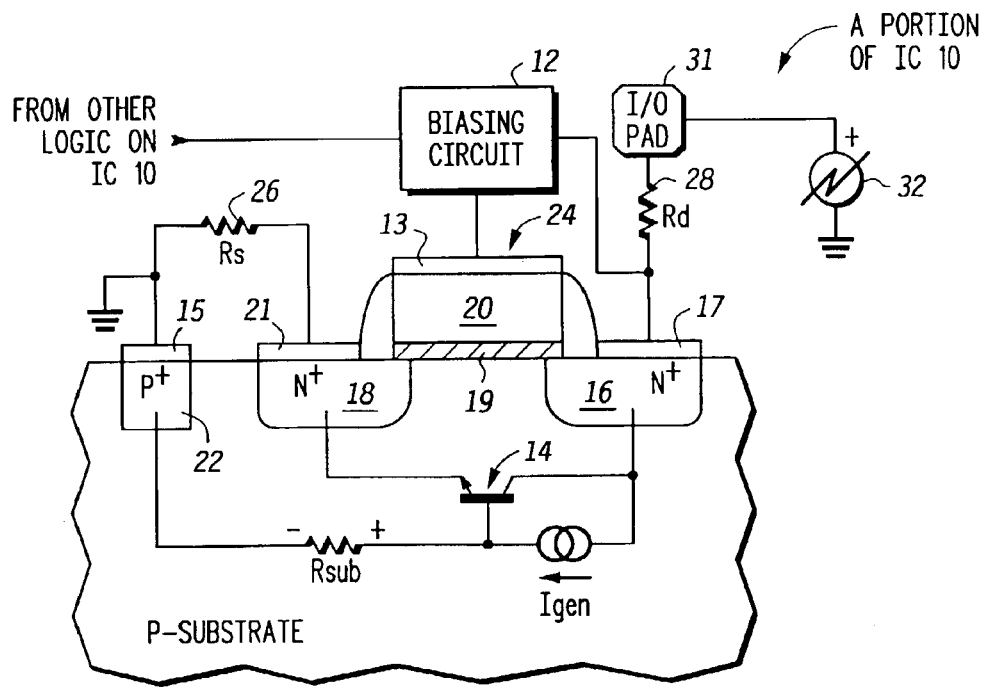
FIG. 3 illustrates, in partial schematic diagram form and partial cross-sectional view, an ESD circuit in accordance with the present invention.

FIG. 3 illustrates an output buffer circuit having ESD protection which is a portion of an integrated circuit (IC) 10. In the embodiment of the present invention illustrated in FIG. 3, a biasing circuit 12 receives a signal from other logic on IC 10, is coupled to the control electrode 20 of N-channel transistor 24, and is coupled to the drain 16 of transistor 24. An output terminal (e.g. I/O pad 31) is capable of being coupled externally to IC 10, and thus can be coupled to an external ESD source 32. In some embodiments of the present invention, I/O pad 31 is coupled to drain 16 by way of a resistor Rd 28. In alternate embodiments, resistor Rd 28 is not used and I/O pad 31 is coupled to drain 16. Resistor Rs 26 has a first terminal which is coupled to a first power supply voltage and a second terminal which is coupled to source 18 of transistor 24. In alternate embodiments, resistor Rs 26 is not used and the first power supply voltage is coupled to source 18 of transistor 24.

N-channel transistor 24 includes a gate region 20, a drain region 16, and a source region 18. Layer 19 is part of gate region 20 and is an oxide insulating layer. In some embodiments, a silicide layer 15 is formed overlying ohmic tie 22 to the body of transistor 24, a silicide layer 21 is formed overlying source 18, a silicide layer 17 is formed overlying drain 16, and a silicide layer 13 is formed overlying gate 20. N-channel transistor 24 includes a parasitic bipolar transistor 14, a current source Igen, and an inherent substrate resistance Rsub.

Figure 4:
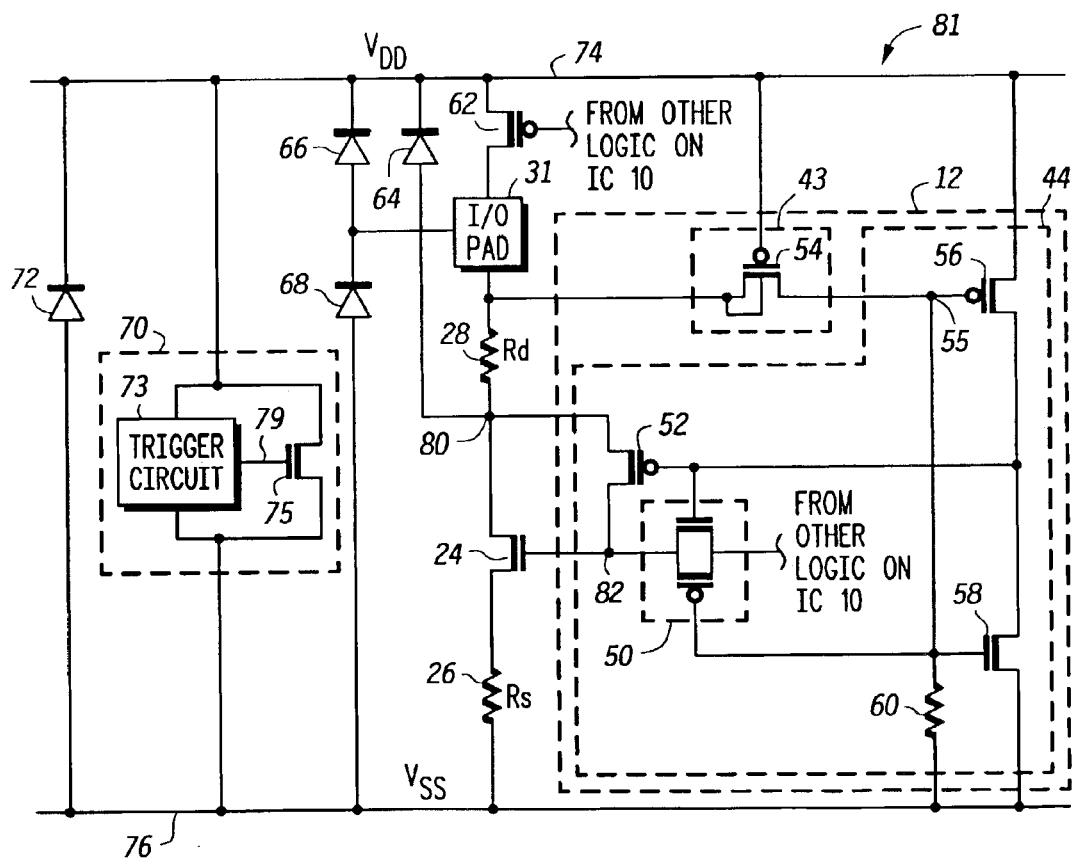
FIG. 4 illustrates, in schematic diagram form, a circuit having ESD protection in accordance with the present invention.

FIG. 4 illustrates a circuit having ESD protection in accordance with one embodiment of the present invention. Circuit 81 includes a node 76 which is coupled to the first power supply voltage (e.g. VSS) and a node 74 which is coupled to a second power supply voltage (e.g. VDD). Diode 72 has a first terminal coupled to the second power supply voltage and a second terminal coupled to the first power supply voltage. ESD rail clamp 70 is coupled to both the first and second power supply voltages. ESD rail clamp 70 contains a trigger circuit 73 and N-channel transistor 75. Transistor 75 has a first current electrode coupled to the second power supply voltage, a second current electrode coupled to the first power supply, and a control electrode connected to a node 79. Trigger circuit 73 is coupled to both the first and second power supply voltages and provides an output signal at node 79. A diode 66 has a first terminal coupled to the second power supply voltage, and a second terminal coupled to both an I/O pad 31 and to a first terminal of a diode 68. The second terminal of diode 68 is coupled to the first power supply voltage.

Still referring to FIG. 4, a P-channel transistor 62 has a first current electrode coupled to the second power supply voltage, has a second current electrode coupled to I/O pad 31, and a control electrode which receives an input signal from other logic (not shown) on IC 10. P-channel transistor 54 has a first current electrode coupled to its own body, to I/O pad 31, and to a first terminal of resistor Rd 28. Transistor 54 has a second current electrode coupled to node 55 and to a control electrode of P-channel transistor 56 and to a first terminal of resistor 60. The control electrode of transistor 54 is coupled to the second power supply voltage. Node 80 is coupled to the second terminal of resistor Rd 28, to a first current electrode of P-channel transistor 52, to a first current electrode of N-channel transistor 24, and to a second terminal of diode 64. The first terminal of diode 64 is coupled to the second power supply voltage. The second current electrode of transistor 24 is coupled to a first terminal of a resistor Rs 26. The second terminal of resistor Rs 26 is coupled to the first power supply voltage. Node 82 is coupled to the control electrode of transistor 24, to the second current electrode of transistor 52, and to the output of a transmission gate 50. The input of the transmission gate 50 is coupled to other logic (not shown) on IC 10. The N-channel control input of transmission gate 50 is coupled to the control electrode of transistor 52, to a second current electrode of P-channel transistor 56, and to a first current electrode of N-channel transistor 58. The P-channel control input of transmission gate 50 is coupled to the control electrodes of transistors 56 and 58 and to the first terminal of resistor 60. The second terminal of resistor 60 is coupled to the first power supply voltage. The first current electrode of transistor 56 is coupled to the second power supply voltage. The second current electrode of transistor 58 is coupled to the first power supply voltage. ESD event detection circuit 43 includes P-channel transistor 54. Switching circuit 44 includes transistors 52, 56 and 58, transmission gate 50, and resistor 60. Biasing circuit 12 includes both ESD event detection circuit 43 and switching circuit 44.

Although the term "resistor" has been used, it is well understood that the resistors illustrated in FIG. 4 are actually resistive elements that may be implemented in any manner, including using transistors or any other suitable device.

ESD rail clamp 70 is shown in FIG. 4 as an active clamp circuit and is used to provide an ESD discharge path between the first and second power supply nodes 76 and 74 when an ESD event is detected by trigger circuit 73. N-channel transistor 75, which is controlled by trigger circuit 73, serves as the primary ESD current shunting device between the first and second power supply nodes 76 and 74. In alternate embodiments of the present invention, ESD rail clamp 70 may be configured differently than shown in FIG. 4. In some embodiments of the present invention, transmission gate 50 is not used and other logic on IC 10 couples more directly to node 82. Note that circuit node 80 is located between drain 16 of transistor 24 (see FIG. 3) and the second terminal of resistor Rd 28. In some embodiments of the present invention the resistance of Rd 28 is zero, while in alternate embodiments of the present invention, the resistance of Rs 26 is zero. Biasing circuit 12 may be implemented in a wide variety of ways. For some embodiments of circuit 81, diode 64 may not be used. In yet other embodiments of circuit 81, biasing circuit 12 and resistor Rs 26 may not be used.

The operation of the circuit 81 illustrated in FIG. 4 will now be described. During an ESD event applied at I/O pad 31 which causes an excessive positive voltage with respect to the first power supply voltage (node 76), circuit 81 provides a first, and primary, ESD current path (Path 1) from the I/O pad 31 to node 76 by way of diode 66, node 74, ESD rail clamp 70, and node 76. The majority of the ESD current, which may exceed 4.0 A (Amperes) peak current, typically follows this path. Therefore, large active devices along Path 1 are used to ensure as low a cumulative resistance along the path as possible. For example, diode 66, and N-channel transistor 75 in ESD rail clamp 70, may typically be sized for very low on-resistance such that, during an ESD event, the I/O pad reaches a peak voltage of 8.0V and node 74 reaches a peak voltage of 4.76V. The total voltage drop across diode 66 is a combination of the normal 0.7V forward biased voltage drop plus the current times resistance (IR) voltage drop. In current integrated circuits, it is difficult to implement a diode 66 with less than about 0.67 ohms resistance. Therefore, for a 4.0 A peak ESD current, there is a 0.7V diode drop plus about a 2.54V IR drop across diode 66. For integrated circuits which utilize diode 66 and ESD rail clamp 70 for ESD protection, as much as one half of the total voltage drop along Path 1 typically occurs across diode 66. In some embodiments of the invention described herein, two secondary ESD current paths, Path 2 and Path 3, are also provided. The second ESD current path (Path 2) is from I/O pad 31 to node 76 by way of resistor Rd 28, N-channel transistor 24, resistor Rs 26, and node 76. The third ESD current path (Path 3) is from I/O pad 31 to node 76 by way of resistor Rd 28, diode 64, node 74, ESD rail clamp 70, and node 76. While both Path 2 and Path 3 augment the primary ESD current path (Path 1) in shunting ESD current between I/O pad 31 and node 76, their intent for some embodiments of the present invention is not to significantly reduce the current routed through Path 1, or the cumulative voltage drop along Path 1. Rather, their intent for some embodiments is to redirect a small portion of the ESD current, which would have been routed along Path 1, and force this current across either resistor Rd 28, Rs 26, or both. As will be described below, the resulting IR voltage drops across these resistors increases the I/O pad voltage at which transistor 24 reaches snapback and suffers permanent ESD damage. Therefore, even higher ESD currents may be routed along Path 1 before N-channel transistor 24 is damaged.

The circuitry associated with Path 2 will be described next. During the ESD event described above, biasing circuit 12 provides a bias voltage on the gate of N-channel transistor 24. ESD current flow along Path 1 through diode 66, insures a significant potential difference between I/O pad 31 and node 74. If the I/O pad voltage exceeds the voltage at node 74 by greater than a P-channel transistor threshold voltage, P-channel transistor 54 will turn on and work to elevate node 55 to the I/O pad voltage. Resistor 60 is sufficiently resistive so that, once P-channel transistor 54 is turned on, it can easily elevate node 55 to near the I/O pad voltage. P-channel transistor 56 and N-channel transistor 58 form a CMOS inverter such that, when node 55 is elevated to the I/O pad voltage, the gate terminal of P-channel transistor 52 is pulled to near the first power supply voltage. This turns on P-channel transistor 52, which then pulls node 82 up to approximately the same voltage as node 80. In this manner, during an ESD event, biasing circuit 12 provides a bias voltage on the gate of N-channel transistor 24, which is substantially equal to the bias voltage at node 80. Node 80 is also the drain terminal of N-channel transistor 24. Therefore, during an ESD event detected by ESD event detection circuit 43, transistor 24 is biased such that its gate voltage (Vgate) is approximately equal to its drain voltage (Vdrain). Biasing circuit 12 also includes a transmission gate 50 which serves to decouple the gate of N-channel transistor 24 from other logic on IC 10 which may interfere with the operation of biasing circuit 12 during the ESD event. It is assumed that, during an ESD event, without biasing circuit 12 present, the other logic on IC 10 may hold or capacitively couple the gate of transistor 24 at or near the voltage of node 76. However, this is not required for proper function of circuit 81. During normal powered operation of IC 10, biasing circuit 12 should not interfere with normal operation of circuit 81. Since the I/O pad voltage typically only swings between the voltages on nodes 76 and 74 during normal circuit operation, P-channel transistor 54 should never turn on, except during an ESD event. Therefore, during all normal circuit operation, node 55 should remain at or near the node 76 potential. This insures that P-channel transistor 52 remains off. In addition, transmission gate 50 is turned on to couple the gate of N-channel transistor 24 to other logic on IC 10, as required for normal operation.

Figure 5:
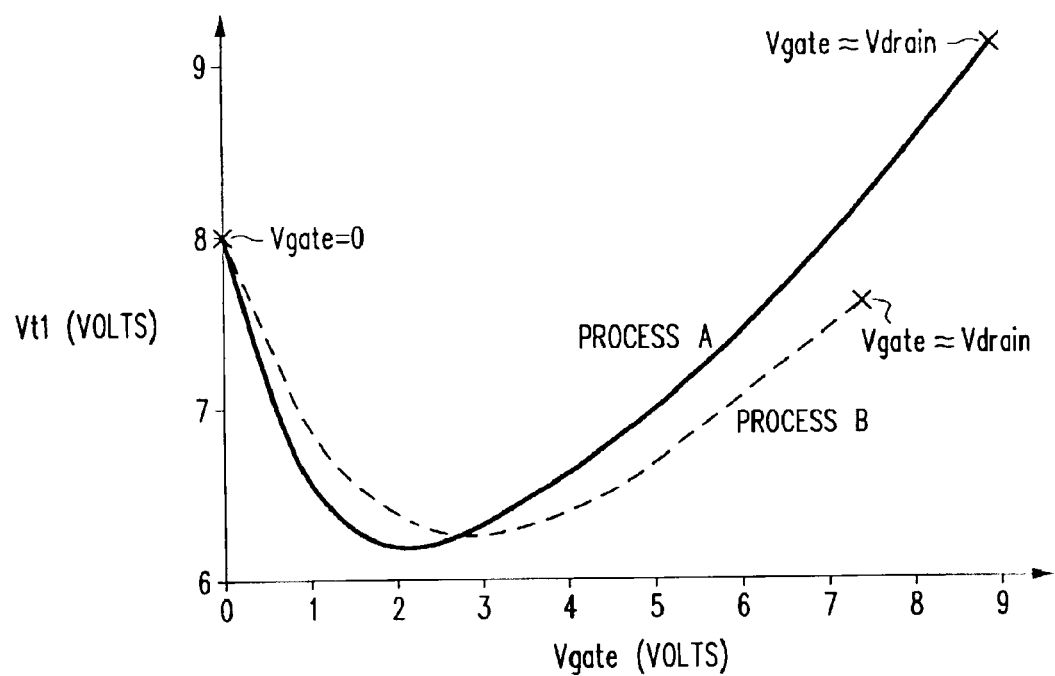
FIG. 5 illustrates, in graphical form, relationships between Vt1 and Vgate for a plurality of circuit configurations.

FIG. 5 is a plot of measurement data for one embodiment of the present invention which shows how Vt1 for N-channel transistor 24 can vary as a function of Vgate. Vt1 data is shown for two example process technologies, Process A and Process B. It is shown that, for both processes, as Vgate is increased from 0V, Vt1 falls from an initial value of about 8V at Vgate=0V, to a minimum value of about 6V at intermediate Vgate bias conditions, and then rises again to higher levels at Vgate≈Vdrain bias conditions. Note that in Process A, Vt1 at Vgate≈Vdrain is about 1.0V higher than Vt1 at Vgate=0V. With Process B, on the other hand, Vt1 at Vgate≈Vdrain≈7.4V, which is about 0.6V lower than Vt1 at Vgate=0V. Therefore, it is clear that an ESD circuit which biases the gate of N-channel transistor 24 to Vgate≈Vdrain alone does not always guarantee an increase in Vt1, when compared to Vgate=0V bias. In fact, for Process B, if resistors Rd 28 and Rs 26 were both set to zero ohms, the presence of biasing circuit 12 in FIG. 4, would likely reduce Vt1 for N-channel transistor 24. One advantage of the embodiment of the present invention described here is that the Vgate≈Vdrain bias conditions on transistor 24 produced by biasing circuit 12, in combination with either Rd 28 or Rs 26, or both resistors, along Path 2, produce a higher "effective" Vt1 for transistor 24. The effective Vt1 for transistor 24 is defined as the I/O pad 31 voltage at which N-channel transistor 24 locally reaches its "intrinsic" (drain to source) Vt1 threshold. It will be shown that the effective Vt1 for transistor 24 is equal to the sum of the intrinsic Vt1 plus any IR voltage drops across resistors Rd 28 and Rs 26. Therefore, by fully turning on N-channel transistor 24 to Vgate≈Vdrain bias, during an ESD event, and by adding Rd 28 or Rs 26, or both resistors in series with this transistor 24, the I/O pad voltage corresponding to snapback (failure) in the transistor to be protected is increased. While not shown in FIG. 5, in some process technologies, a slight further increase in Vt1 is seen as Vgate is biased to a voltage greater than Vdrain. However, due to concern about damaging the transistor 24 gate oxide during an ESD event due to the excessive applied voltage, Vgate is usually limited to a value within a few volts of Vdrain. In some embodiments of the present invention biasing circuit 12 may produce Vgate>Vdrain bias conditions on transistor 24.

Figure 6:
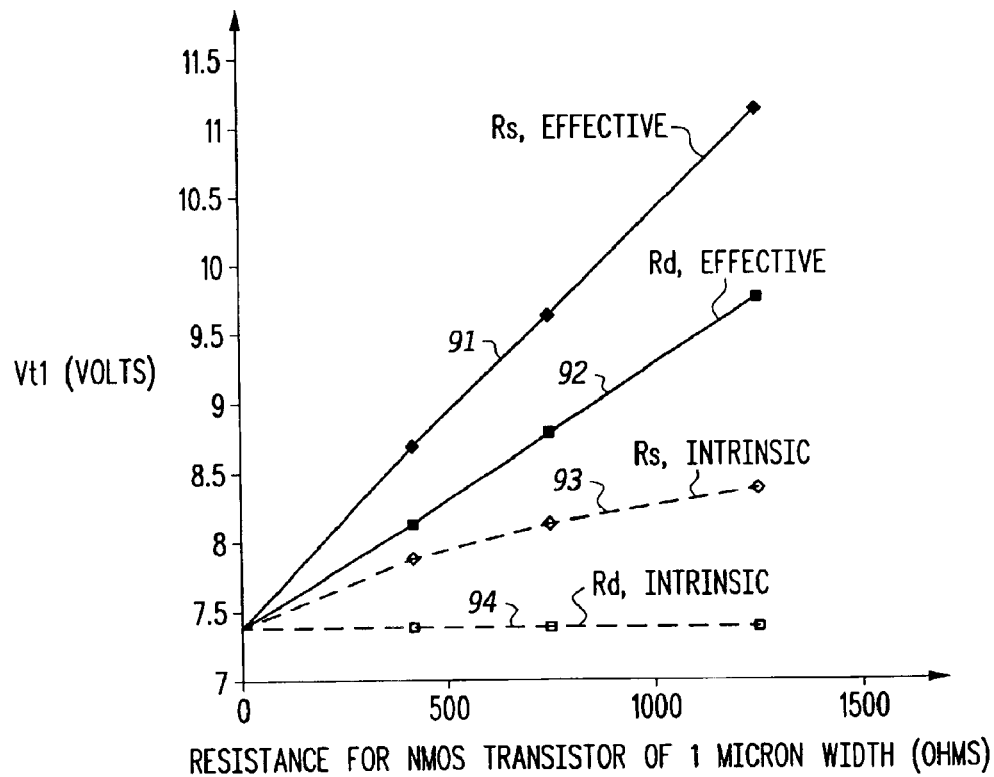
FIG. 6 illustrates, in graphical form, relationships between Vt1 and resistance for a plurality of processes.

In FIG. 6, Vt1 data for some embodiments of the present invention, measured with Vgate=Vdrain bias conditions, are shown as a function of either added drain side (Rd 28 in FIG. 4) or source side (Rs 26 in FIG. 4) series resistance. The resistance values shown correspond to an N-channel transistor 24 of 1 micron (micrometers) channel width. For wider transistors, these resistance values may be divided by the transistor channel width to obtain the necessary resistance values to achieve the same Vt1 performance. Four curves are plotted in FIG. 6. Curve 92, also labeled "Rd, Effective" will be described first. This curve shows the increase in the effective Vt1 as the drain side resistor Rd 28 is increased in magnitude from 0 ohms. Resistor Rs 26 is assumed equal to zero ohms in this case. The effective Vt1 is seen to increase from 7.4V with Rd=0 ohms up to 9.7V with Rd=1250 ohms. In FIG. 6, it can be seen that Curve 94, also labeled "Rd Intrinsic," is horizontal. This curve plots the intrinsic Vt1 for the N-channel transistor 24, which may be measured between the drain and source terminals of the device. It can be seen that the intrinsic Vt1 is constant at 7.4V for all values of resistor Rd 28. By comparing Curve 92 with Curve 94 it can be seen that the improvement in effective Vt1 can be wholly attributed to IR voltage drops across resistor Rd 28 during the ESD event. It is clear that for this embodiment of the present invention, any effective Vt1 target between 7.4V and 9.8V can be achieved by selecting a corresponding value for Rd between 0 ohms and 1250 ohms.

Curve 91, also labeled "Rs, Effective" will now be described. This curve shows the increase in effective Vt1 as the source side resistor Rs 26 is increased in magnitude from 0 ohms. Resistor Rd 28 is assumed equal to zero ohms in this case. The effective Vt1 is seen to increase from 7.4V with Rs=0 ohms up to 11.2V with Rs=1250 ohms. In contrast to Curve 94, Curve 93, also labeled "Rs Intrinsic," is not horizontal, but exhibits an increase from 7.4V at Rs=0 ohms to 8.3V at Rs=1250 ohms. This increase in the intrinsic Vt1 for the transistor with increasing resistance in Rs is due to de-biasing of the parasitic NPN bipolar transistor. Since the N-channel transistor 24 substrate is connected directly to node 76, while the source is connected to node 76 through resistor Rs 26, any Path 2 current flow through Rs will serve to elevate the source potential of the transistor above the substrate potential. This creates a reverse bias on the transistor source-substrate junction. Since the source of N-channel transistor 24 is also the emitter of the inherent parasitic NPN bipolar transistor, the emitter-base junction of the NPN is also reverse biased. This inhibits parasitic NPN snapback which, as was described earlier, is initiated by forward biasing of this emitter-base junction. The intrinsic Vt1 for N-channel transistor 24 increases, because higher avalanche current generation (Igen), and therefore a larger drain voltage, is needed before the local substrate potential is sufficiently elevated to forward bias the emitter-base junction of the bipolar transistor. The IR voltage drop across Rs 26 provides some reverse biasing of the bipolar transistor emitter-base junction, thereby inhibiting snapback. As can be seen from Curve 91 and Curve 93, the source side resistor (Rs 26) increases the effective Vt1 for transistor 24 in two ways. First there is the effective Vt1 increase due to IR voltage drop across resistor Rs 26. Second there is an intrinsic Vt1 increase due to the de-biasing effect on the NPN bipolar transistor. As can be seen in FIG. 6, due to the combination of these two effects, there is a greater increase in effective Vt1 when a resistance of a given value is placed on the source side of N-channel transistor 24, rather than on the drain side for some embodiments of the present invention. However, both resistors may be effectively used to increase the effective Vt1 value. It is clear that for this embodiment of the present invention, any effective Vt1 target between 7.4V and 11.2V can be achieved by selecting a corresponding value for Rs between 0 ohms and 1250 ohms.

One embodiment of the present invention includes biasing circuit 12 which provides Vgate≈Vdrain bias conditions to N-channel transistor 24 in FIG. 4, to insure significant MOSFET current flow through this device 24 during an ESD event. In addition, either Rd 28 or Rs 26, or both, are added in series with transistor 24, along ESD current Path 2. During an ESD event, the combination of these elements significantly increases the effective Vt1 for transistor 24. Since it is assumed that Vt2=Vt1 for transistor 24, maximizing Vt1 also greatly increases the ESD failure voltage of the transistor. While drain-side ESD resistors have been used in prior approaches for ESD protection, these resistors have typically been used as ballast resistors only, to insure uniform bipolar current flow across the conducting width of the transistor 24, after bipolar snapback. In the invention described here, the goal is to increase the effective Vt1 of transistor 24 so that, during an ESD event, snapback may be avoided altogether.

Any added source or drain side resistance in series with transistor 24 in FIG. 4 will, in most cases, negatively impact normal I/O circuit electrical performance. Therefore, simulations can be used to compare the ESD improvement versus electrical performance degradation tradeoffs of a given Rd or Rs resistance value. In most cases, some resistance can be tolerated in order to achieve increased ESD robustness at I/O pad 31. A significant advantage of all embodiments of the present invention is that the ESD circuit can be easily simulated with standard circuit simulation tools like SPICE. Prior art circuits, which rely on parasitic bipolar snapback of transistor 24 during an ESD event, are very difficult to simulate with SPICE.

The ESD circuitry associated with Path 3 will be explained next. As described above, during an ESD event, any current through resistor Rd 28 in FIG. 4 along Path 2 produces an IR voltage drop across the resistor, and therefore an increase in the effective Vt1 for N-channel transistor 24. Diode 64 provides another means to route ESD current through resistor Rd 28 via current Path 3. This additional current produces a further IR voltage drop across resistor Rd 28, and therefore, a further increase in the effective Vt1 for N-channel transistor 24. Even if current Path 2 is blocked (e.g. biasing circuit 12 removed and transistor 24 is off) during an ESD event, resistor Rd 28 in series with diode 64 can provide a significant increase in the effective Vt1 for N-channel transistor 24, over its intrinsic Vt1 value. As described earlier, during a typical 4.0 A ESD event, the I/O pad 31 may reach 8.0V and node 74 may reach 4.76V. This 3.24V potential difference between the I/O pad 31 and node 74 is due to the voltage drop across diode 66, due to the very high current flow through this device, as part of the primary ESD current path (Path 1). Therefore, under these bias conditions, diode 64 will forward bias, and conduct current if node 80 is elevated to a voltage in excess of a diode drop (approximately 0.7V) above node 74. Therefore, if node 80 is elevated above 5.46V, diode 64 will forward bias and turn on Path 3. This current produces an IR voltage drop across resistor Rd 28, and therefore, an increase in the effective Vt1 for N-channel transistor 24.

The impact of the circuitry associated with Path 2 and Path 3 on the effective Vt1 of N-channel transistor 24 for some embodiments of the present invention is demonstrated with the SPICE simulation data shown in the table of FIG. 7. All simulations were performed assuming a 4.0 A peak current positive ESD event applied to I/O pad 31, with respect to grounded node 76. For all simulations the diode 66 active perimeter was set to 300 microns, the diode 64 active perimeter was set to 30 microns, the rail clamp N-channel transistor 75 channel width was set to 2920 microns, the N-channel transistor 24 channel width was set to 150 microns, and Rd was set to 4 ohms. In addition, for all simulations Rs was set to 0 ohms. In FIG. 7 the simulated peak voltages on three nodes in circuit 81, I/O pad 31, node 80, and node 74, are listed for four different ESD circuit configurations or cases. In Case 1, only the primary ESD current path (Path 1) is present to conduct ESD current. This assumes that diode 64 and biasing circuit 12 are removed from circuit 81 in FIG. 4. In Case 2, only Path 1 and Path 2 are present to conduct ESD current. This assumes diode 64 is removed from circuit 81. In Case 3, only Path 1 and Path 3 are present to conduct ESD current. This assumes that biasing circuit 12 is removed from circuit 81. In Case 4, all three paths, Path 1, Path 2, and Path 3, are present to conduct ESD current.

The data for Case 1 will be discussed first. In Case 1, the I/O pad 31 and the node 74 voltages are 8V and 4.76V, respectively. Since there is no current flow through transistor 24, the voltage at node 80 is 8V, which is the same as the I/O pad 31. Note that the full I/O pad voltage (8V) is applied across transistor 24. In FIG. 5 it was shown that Vt1 for transistor 24 is about 8V with Vgate=0V. Therefore, in Case 1, transistor 24 is biased right at its ESD failure threshold.

In Case 2 the I/O pad 31, node 80, and node 74 voltages are 7.6V, 6.56V, and 4.48V, respectively. Comparing this data to Case 1, it can be seen that while the voltage at the I/O pad 31 drops 0.4V, the voltage at node 80 drops 1.44V. Therefore transistor 24 is biased 1.44V below its failure threshold, and a significantly higher ESD current would be necessary to elevate I/O pad 31 to the effective Vt1 for transistor 24. It is clear that biasing circuit 12, resistor Rd 28, and transistor 24 (devices along Path 2) reduce the effective Vt1 of transistor 24.

In Case 3 the I/O pad 31, node 80, and node 74 voltages are 7.87V, 7.03V, and 4.73V, respectively. Comparing these data to Case 1, it can be seen that while the I/O pad 31 voltage drops only 0.13V, the voltage at node 80 drops 0.97V. Therefore transistor 24 is biased 0.97V below its failure threshold, and a significantly higher ESD current would be necessary to elevate I/O pad 31 to the effective Vt1 for transistor 24. It is clear that diode 64 and resistor Rd 28 (devices along a portion of Path 3) reduce the effective Vt1 of transistor 24.

In Case 4 the I/O pad 31, node 80, and node 74 voltages are 7.56V, 6.2V, and 4.48V, respectively. Comparing this data to Case 1, it can be seen that while the voltage at the I/O pad 31 drops 0.44V, the voltage at node 80 drops 1.8V. Therefore transistor 24 is biased 1.8V below its failure threshold, and a significantly higher ESD current would be necessary to elevate I/O pad 31 to the effective Vt1 for transistor 24. It is clear that biasing circuit 12, resistor Rd 28, and transistor 24 (devices along Path 2) along with diode 64 (device along a portion of Path 3) can work in combination to reduce the effective Vt1 of transistor 24.

From the data in FIG. 7, it can be seen that while both Path 2 and Path 3 augment the primary ESD current path (Path 1) in shunting ESD current between I/O pad 31 and node 76, these two secondary current paths do not significantly reduce the peak voltage at I/O pad 31. In some embodiments of the present invention, the intent of both Path 2 and Path 3 is to redirect a small portion of the ESD current which would have been routed along Path 1 and force this current across resistor Rd 28. The resulting IR voltage drop across this resistor reduces the voltage at node 80 and therefore increases the I/O pad voltage at which transistor 24 reaches snapback and suffers permanent ESD damage. Therefore, even higher ESD currents may be routed along Path 1 before N-channel transistor 24 is damaged.

For all example simulation data shown in FIG. 7, it is assumed that Rs 26 is set to 0 ohms. If Rs 26 is non-zero in these simulations, the resulting IR voltage drop across this resistor increases the voltage at the source terminal of N-channel transistor 24 above ground (node 76). This reduces the drain to source potential difference across transistor 24. In addition, since the source of transistor 24 is elevated above its grounded substrate, the intrinsic Vt1 for transistor 24 is increased, due to the bipolar snapback inhibiting effect described earlier.

In one embodiment of the present invention, biasing circuit 12, in FIG. 4, may be implemented in combination with non-zero resistor Rd 28, while resistor Rs 26 is set to 0 ohms, and diode 64 is removed. In an alternate embodiment of the present invention, biasing circuit 12 may be implemented in combination with non-zero resistor Rs 26, while resistor Rd 28 is set to 0 ohms, and diode 64 is removed. In a further alternate embodiment of the present invention, diode 64 may be implemented in combination with non-zero resistor Rd 28, while resistor Rs 26 is set to 0 ohms, and biasing circuit 12 is removed. In addition, any of the three embodiments listed above may be used in any combination.

In some embodiments of the present invention, the intended purpose of biasing circuit 12 in FIG. 4 is to provide the Vgate≈Vdrain bias conditions on transistor 24 during a detected ESD event. One skilled in the art would recognize that biasing circuit 12 may be implemented in a wide variety of circuit configurations. As an example, ESD event detection circuit 43 may be modified by removing P-channel transistor 54 and connecting node 55 to node 79 in the ESD rail clamp circuit 70. Biasing circuit 12 would then simply rely on the trigger circuit 73, in ESD rail clamp 70, to detect an ESD event. In alternate embodiments of the present invention, the intended purpose of biasing circuit 12 is to provide Vgate>Vdrain bias conditions on transistor 24 during a detected ESD event. Biasing circuit 12 in FIG. 4 may easily be modified for producing Vgate>Vdrain bias conditions by disconnecting the first current electrode of P-channel transistor 52 from node 80 and connecting it to I/O pad 31. With this modification to biasing circuit 12 in FIG. 4, during an ESD event, Vgate will be pulled higher than Vdrain, by an amount equal to the IR voltage drop across resistor Rd 28. A wide variety of circuit configurations may be used to implement the present invention.

For embodiments of circuit 81 in which the resistance of Rd 28 is non-zero, during at least 10% of a duration of an ESD event, the biasing circuit 12 applies a voltage to the control electrode of transistor 24 that is approximately equal to or substantially tracks a voltage at a circuit node 80 located between the first current electrode of transistor 24 and the second terminal of resistor Rd 28, inclusively. For alternate embodiments, the percentage is at least 50% instead of at least 10%.

For embodiments in which the resistance of Rd 28 is zero, during at least 10% of a duration of an ESD event, the biasing circuit 12 applies a voltage to the control electrode of transistor 24 that is approximately equal to or substantially tracks a voltage at a circuit node 80 located between the first current electrode of transistor 24 and the I/O pad 31, inclusively. For alternate embodiments, the percentage is at least 50% instead of at least 10%.

Although the invention has been described with respect to specific conductivity types or polarity of potentials, skilled artisans appreciated that conductivity types and polarities of potentials may be reversed. For example, the N-channel transistor 24 to be protected from ESD may be a P-channel transistor instead. Also, although specific voltages, resistances, dimensions, etc. have been used for selected examples described herein, these selected examples were for illustrative purposes only and in no way are intended to limit the scope of the present invention.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An output circuit having ESD protection, comprising:
   an output terminal;
   a transistor to be protected from ESD, the transistor having a first current electrode, a second current electrode coupled to a first voltage supply, and a control electrode;
   a first resistive element having a first terminal coupled to the output terminal and a second terminal coupled to the first current electrode of the transistor; and
   a biasing circuit coupled to the control electrode of the transistor, wherein, during at least ten percent of a duration of an ESD event, the biasing circuit applies a voltage to the control electrode of the transistor that is approximately equal to a voltage at a circuit node located between the first current electrode of the transistor and the output terminal.

2. The circuit of claim 1, wherein the biasing circuit applies the voltage to the control electrode of the transistor during at least fifty percent of the duration of the ESD event.

3. The circuit of claim 1, wherein the circuit node is located at one of the first or the second terminals of the first resistive element.

4. The circuit of claim 1, wherein the circuit node is located at the first current electrode of the transistor.

5. The circuit of claim 1, wherein during the ESD event, the biasing circuit couples the circuit node to the control electrode of the transistor.

6. The circuit of claim 5, wherein the circuit node is located at the first current electrode of the transistor and the biasing circuit further comprises:
   an ESD event detection circuit coupled to the output terminal for detecting the ESD event; and
   a switching circuit coupled to the ESD event detection circuit, the first current electrode of the transistor, and the control electrode of the transistor, wherein the switching circuit couples the first current electrode of the transistor to the control electrode of the transistor in response to the ESD event detection circuit detecting the ESD event.

7. The circuit of claim 1, wherein the transistor comprises an NMOS transistor.

8. The circuit of claim 1, further comprising a second resistive element coupled between the transistor and the first voltage supply, the second resistive element having a first terminal coupled to the second current electrode of the transistor and a second terminal coupled to the first voltage supply.

9. The circuit of claim 1, further comprising a diode having a first terminal coupled to the circuit node, and a second terminal coupled to a second voltage supply.

10. An output circuit having ESD protection, comprising:
    an output terminal;
    a transistor to be protected from ESD, the transistor having a first current electrode, a second current electrode, and a control electrode;
    a first resistive element having a first terminal coupled to the second current electrode of the transistor and a second terminal coupled to a first voltage supply; and
    a biasing circuit coupled to the control electrode of the transistor, wherein, during at least ten percent of a duration of an ESD event, the biasing circuit applies a voltage to the control electrode of the transistor that is approximately equal to a voltage at a circuit node located between the first current electrode of the transistor and the output terminal.

11. The circuit of claim 10, wherein the biasing circuit applies the voltage to the control electrode of the transistor during at least fifty percent of the duration of the ESD event.

12. The circuit of claim 10, wherein the circuit node is located at the first current electrode of the transistor.

13. The circuit of claim 10, wherein during the ESD event, the biasing circuit couples the circuit node to the control electrode of the transistor.

14. The circuit of claim 13, wherein the circuit node is located at the first current electrode of the transistor and the biasing circuit further comprises:

an ESD event detection circuit coupled to the output terminal for detecting the ESD event; and a switching circuit coupled to the ESD event detection circuit, the first current electrode of the transistor, and the control electrode of the transistor, wherein the switching circuit couples the first current electrode of the transistor to the control electrode of the transistor in response to the ESD event detection circuit detecting the ESD event.

15. The circuit of claim 10, wherein the transistor comprises an NMOS transistor.

16. The circuit of claim 10, further comprising a second resistive element coupled between the first current electrode of the transistor and the output terminal.

17. A method for providing ESD protection for an NMOS transistor having a first current electrode coupled via a resistive element to an output terminal, a second current electrode, and a control electrode, comprising:

detecting an occurrence of an ESD event; and in response to detecting the occurrence of the ESD event, applying a voltage to the control electrode of the NMOS transistor that substantially tracks a voltage at a circuit node located between the NMOS transistor and the output terminal during at least ten percent of a duration of the ESD event, and wherein, during the at least ten percent of the duration, the NMOS transistor provides a current path through the resistive element.

18. The method of claim 17, wherein applying further comprises coupling the control electrode of the NMOS transistor to the circuit node.

19. The method of claim 17 further comprising applying a current through the resistive element during the ESD event to increase a voltage at the output terminal.

20. A method for providing ESD protection for an NMOS transistor having a first current electrode coupled to an output terminal, a second current electrode coupled via a resistive element to a supply voltage, and a control electrode, comprising:

detecting an occurrence of an ESD event; and in response to detecting the occurrence of the ESD event, applying a voltage to the control electrode of the NMOS transistor that substantially tracks a voltage at a circuit node located between the NMOS transistor and the output terminal during at least ten percent of a duration of the ESD event and wherein, during the at least ten percent of the duration, the NMOS transistor provides a current path through the resistive element.

21. The method of claim 20, wherein applying further comprises coupling the control electrode of the NMOS transistor to the circuit node.

22. The method of claim 20 further comprising applying a current through the resistive element during the ESD event to increase a voltage at the output terminal and inhibit a bipolar transistor of the NMOS transistor from turning on.

23. An output circuit having ESD protection, comprising:

an output terminal;

a resistive element having a first terminal coupled to the output terminal and a second terminal; and a transistor to be protected from ESD, the transistor having a first current electrode coupled to the second terminal of the first resistive element, a second current electrode coupled to a first voltage supply, and a control electrode, wherein, during at least fifty percent of a duration of an ESD event, the transistor provides a current path from the output terminal through the resistive element.

24. An output circuit having ESD protection, comprising:

an output terminal;

a resistive element having a first terminal coupled to a first voltage supply and a second terminal; and a transistor to be protected from ESD, the transistor having a first current electrode coupled to the output terminal, a second current electrode coupled to the second terminal of the resistive element, and a control electrode, wherein, during at least fifty percent of a duration of an ESD event, the transistor provides a current path from the output terminal through the resistive element.

* * * * *